United States Patent [19]
Harada et al.

[11] Patent Number: 5,849,636
[45] Date of Patent: Dec. 15, 1998

[54] METHOD FOR FABRICATING A SEMICONDUCTOR WAFER

[75] Inventors: Takamitsu Harada; Kouichi Imura; Hisaya Fukunaga, all of Miyazaki; Masahiko Maeda, Higashimorokata-gun, all of Japan

[73] Assignee: Komatsu Electronic Metals Co., Ltd., Hiratsuka, Japan

[21] Appl. No.: 767,032

[22] Filed: Dec. 12, 1996

[51] Int. Cl.⁶ .................................................. H01L 21/302
[52] U.S. Cl. .......................... 438/691; 438/747; 438/974
[58] Field of Search .................... 438/690, 747, 438/753, 906, 974, 977, 691

[56] References Cited

U.S. PATENT DOCUMENTS

| | | | |
|---|---|---|---|
| 3,480,474 | 11/1969 | Emeis et al. | 117/224 |
| 4,276,114 | 6/1981 | Takano et al. | 438/691 |
| 5,066,359 | 11/1991 | Chiou | 438/691 |
| 5,360,509 | 11/1994 | Zakaluk et al. | 438/691 |
| 5,447,890 | 9/1995 | Kato et al. | 438/974 |
| 5,494,862 | 2/1996 | Kato et al. | 438/753 |
| 5,516,706 | 5/1996 | Kasakabe | 438/691 |

*Primary Examiner*—Robert Kunemund
*Assistant Examiner*—Anita Alanko
*Attorney, Agent, or Firm*—Varndell Legal Group

[57] ABSTRACT

A method processes a semiconductor wafer by etching the wafer, which has been smoothed by rough lapping, with alkaline solution. A rod is sliced into a plurality of wafers. The peripheral edges of the wafers are chamfered. The processed strain layers over the wafers due to chamfering are smoothed and planarized. The processed strain layers are then removed by etching with alkaline solution. The etched wafers are mirror polished. Lastly, the mirror-polished wafers are cleaned.

4 Claims, 3 Drawing Sheets

METHOD FOR FABRICATING A SEMICONDUCTOR WAFER

BACKGROUND OF THE INVENTION

1. Field of the Invention

The present invention relates to a method for fabricating a semiconductor wafer by using an alkaline solution.

2. Description of Related Art

A conventional semiconductor wafer fabrication method includes a slicing step, a chamfering step, a lapping step, an etching step, a single-side polishing step, and a cleaning step in fabricating a wafer for forming an electronic component.

However, the surface roughness of the wafer is enhanced in the conventional fabrication method. Referring to FIG. 3A, a surface of the sliced wafer 1 is lapped. After the lapping step, rough interfaces 3 exist between processed strain layers 2 and the wafer 1, as shown in FIG. 3B. Even thought the processed layers 3 can be easily removed by etching, the surface roughness of the wafer, as shown in FIG. 3C, will be enhanced after the etching step. Furthermore, in order to improve the yield of electronic devices, semiconductor wafers of extremely high flatness are required. Therefore, a conventional method for fabricating the wafers is difficult to remain the flatness of semiconductor wafer.

SUMMARY OF THE INVENTION

Accordingly, the present invention provides a method for fabricating semiconductor wafers of very high flatness. In the method, lapped wafers are etched by alkaline solution.

The present invention includes the steps of: (1) a step A for slicing an ingot into a plurality of wafers; (2) a step B for chamfering a peripheral edge of each of the sliced wafers; (3) a step C for smoothing surfaces of the processed strain layers on the chamfered wafer; (4) a step D for etching away the processed strain layers on the wafer; (5) a step E for mirror polishing the surfaces of the etched wafer; and (6) a step F] for cleaning the mirror-polished wafers.

The smoothing step of the present invention can be carried out by lapping the sliced surfaces of the wafers. The grains for lapping may be #1200 or larger size number. Moreover, the step can be carried out in a lapping apparatus which includes a fluid axis bearing mechanism.

In the fabrication method of the present invention, if grains whose size numbers are larger than #1200 are utilized in the smoothing step, the processed strain layers with various degrees of roughness can be removed by specific alkaline solution in the subsequent etching step to improve the flatness of the wafer surface. Therefore, the function of the etching step can be improved.

BRIEF DESCRIPTION OF THE INVENTION

DETAILED DESCRIPTION OF THE INVENTION

Figure 1:
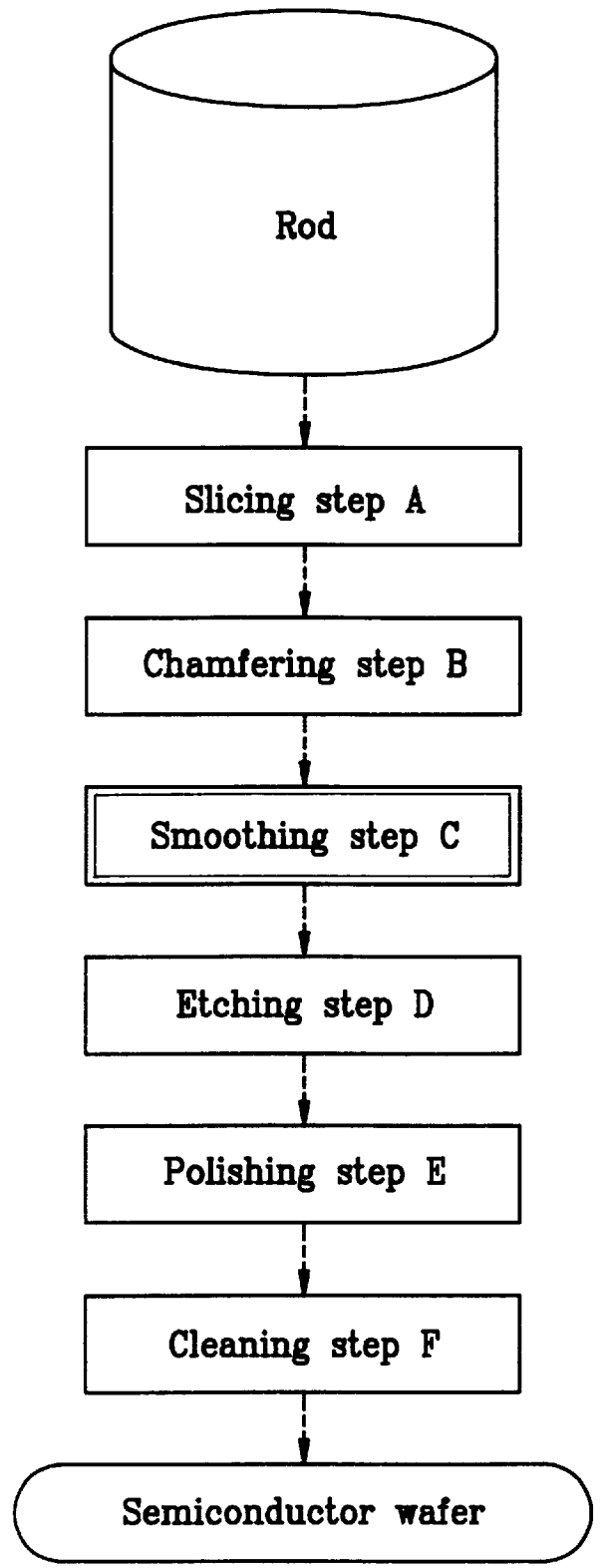
FIG. 1 illustrates the process steps in the embodiment of the present invention.

The embodiment of the present invention will be described in accompaniment with the drawings in which a silicon wafer 1 is fabricated. The wafer 1 can be obtained by, for example, etching with alkaline solution. Referring to FIG. 1, the method includes the steps of: a slicing step A for slicing an ingot into a plurality of wafers; a chamfering step B for chamfering a peripheral edges of each of the wafers; a smoothing step C for smoothing surfaces of the processed strain layers on the chamfered wafer; an etching step D for etching away the processed strain layers on the wafers; a polishing step E for mirror-polishing the surfaces of the etched wafers; and a cleaning step F for cleaning the polished wafers.

Figure 2A:
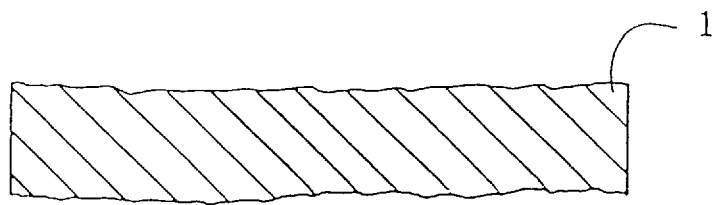
FIG. 2A through FIG. 2C are cross-sectional views illustrating the surface configuration of the wafer fabricated according to the steps of FIG. 1.
Figure 2B:
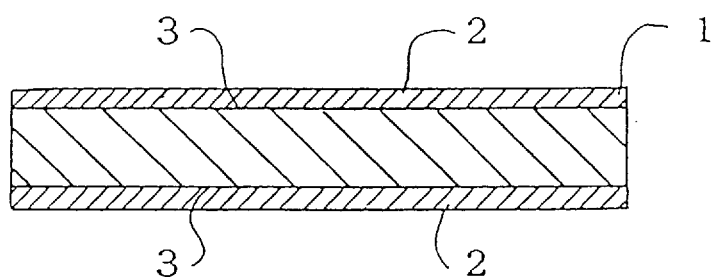
Figure 2C:
Figure 3A:
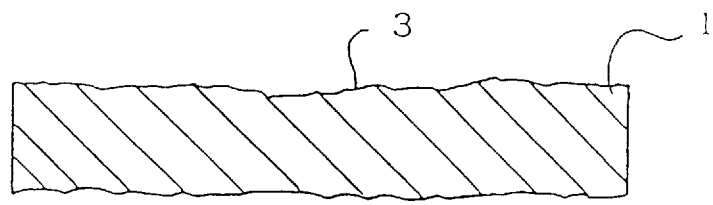
FIG. 3A through FIG. 3C are cross-sectional views of a wafer, in different process steps, fabricated by the conventional method.
Figure 3B:
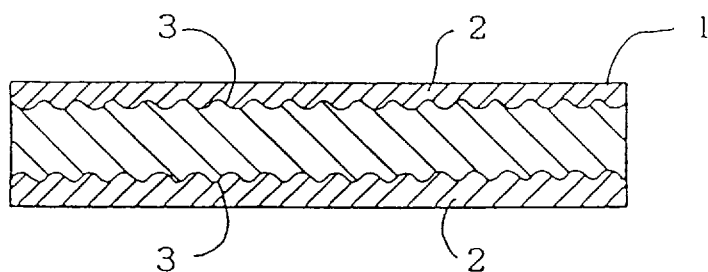
Figure 3C:
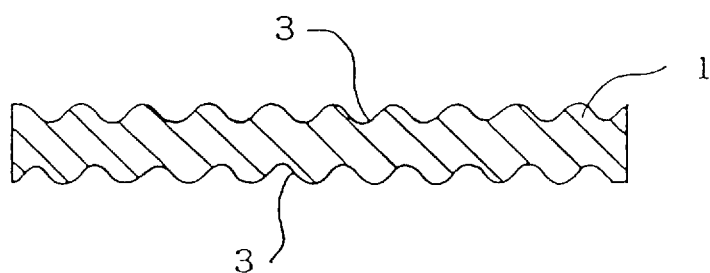

When the smoothing step is carried out by multi-stage lapping the wafers for flatness, the size of the grains for lapping in later stages effects the variation (TTV) of the processed strain layer. As shown in Table 1, if the wafer is processed by grains of a size number larger than #1200, as compared with those processed by the grain size of #1000 and the conventional surface polishing, the TTV can be reduced to 0.01 $\mu$m. Referring to FIG. 2A through FIG. 2C, the interface roughness 3 between the processed layers 2 and the wafer 1 disappears after the etching step. Moreover, in the chamfering step for processing the peripheral edges of the sliced wafers, the same method as that of the smoothing step C described above can be applied to improve the surface flatness. The grain sizes #1200 and #1000 discussed above correspond to Japanese Industrial Standard (JIS).

TABLE 1

|  | Before etching | After etching | Variation TTV |
| --- | --- | --- | --- |
| Surface ground wafer | 1.07 $\mu$m | 1.73 $\mu$m | 0.66 $\mu$m |
| Lapped wafer (#1000) | 1.62 $\mu$m | 1.94 $\mu$m | 0.32 $\mu$m |
| Lapped wafer (#1200) | 1.07 $\mu$m | 1.06 $\mu$m | −0.01 $\mu$m |

Moreover, when the smoothing step C is carried out by a lapping apparatus to process the semiconductor wafer 1 which will be etched in an etching apparatus in the etching step, a fluid axis bearing mechanism (not shown in the figure) can be utilized to force a press plate (not shown in the figure) for lapping the wafer. Therefore, less vibration will be generated from the lower holding plate of the wafer, and the surface roughness in the smoothing steps can be further eliminated.

The surface conditions of the wafer can be examined by an apparatus such as an X-ray phase-difference microscope. The surface roughness 3 on the surface of the processed strain layers after the smoothing step C can be considered suppressed by etching if no surface roughness with a dimension of more than 1.07 $\mu$m is observed with the microscope.

Moreover, even though the grain size is preferably #1200 or larger size number in the smoothing step, grains smaller than that can also be utilized in the present invention if they can achieve the flatness effect in accompaniment with the subsequent etching step.

Since the present invention introduces a smoothing step for smoothing the processed strain layers over the wafers prior to the etching step, the wafer surface, even though processed by lapping and etching, can remain a very high degree of flatness.

What is claimed is:

1. A method for fabricating a semiconductor wafer, comprises the steps of:

slicing a plurality of wafers;

chamfering an edge of each of the wafers;

smoothing rough surfaces of processed strain layers of each of the chamfered wafers using grains with a size number larger than #1200;

etching and removing the processed layers of each of the wafers which have been smoothed by an alkaline solution;

mirror polishing the surfaces of each of the etched wafers; and cleaning the mirror-polished wafers.

2. The method as claimed in claim 1, wherein the wafers are smoothed by lapping their sliced surfaces.

3. The method as claimed in claim 1, wherein the wafers are smoothed by means of a lapping apparatus which includes a fluid axis bearing mechanism.

4. The method as claimed in claim 2, wherein the wafers are smoothed by means of a lapping apparatus which includes a fluid axis bearing mechanism.

* * * * *